(12) United States Patent
Kaneko

(10) Patent No.: US 6,255,736 B1
(45) Date of Patent: Jul. 3, 2001

(54) THREE-DIMENSIONAL MCM, METHOD FOR MANUFACTURING THE SAME, AND STORAGE MEDIUM STORING DATA FOR THE METHOD

(75) Inventor: Yoshio Kaneko, Chiba-ken (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/136,931

(22) Filed: Aug. 20, 1998

(30) Foreign Application Priority Data

Aug. 20, 1997 (JP) ................................................ 9-223663

(51) Int. Cl.[7] .......................... H01L 23/48; H01L 23/52; H01L 25/40
(52) U.S. Cl. .......................... 257/777; 257/786; 257/778; 257/723
(58) Field of Search .......................... 257/777, 778, 257/723, 724, 786, 780, 781

(56) References Cited

U.S. PATENT DOCUMENTS

| | | | |
|---|---|---|---|
| 5,243,208 | * | 9/1993 | Isomura et al. . |
| 5,386,623 | * | 2/1995 | Okamoto et al. . |
| 5,717,245 | * | 2/1998 | Pedder . |
| 5,783,870 | * | 7/1998 | Mostafazadeh et al. . |
| 5,894,166 | * | 4/1999 | Surridge . |
| 5,923,090 | * | 7/1999 | Fallon et al. . |
| 5,923,091 | * | 7/1999 | Nagai . |
| 5,946,545 | * | 8/1999 | Bertin et al. . |
| 5,995,379 | * | 11/1999 | Kyougoku et al. . |
| 6,057,598 | * | 5/2000 | Payne et al. . |

* cited by examiner

Primary Examiner—Sheila V. Clark
(74) Attorney, Agent, or Firm—Foley & Lardner

(57) ABSTRACT

A manufacturing method for a three-dimensional MCM, having a standard cell or embedded array as a basechip, is provided. On the basechip an external chip is stacked with bumps sandwiching between them. In the case that the standard cell is employed as the base chip, the method comprises the steps of: logic designing a standard cell; designing layout of the macrocell, a bump pad and interconnections on a basechip; fabricating a mask pattern based on the result of designing layout; manufacturing the standard cell on the basechip using the mask pattern; and three-dimensionally assembling an external chip and the basechip via a bump provided on the bump pad. The logic designing is conducted based on a system specification defining various design conditions relating to the standard cell. The designing layout of the macrocell, a bump pad and interconnections on a basechip is conducted using the logic design result, macrocell cell information and bump pad cell information. The present invention also provides an MCM having a base chip which comprises an ASIC, such as a standard cell or an embedded array, manufactured using these automatically designed interconnections and a base chip needed when assembling this MCM. The present invention further provides a storage medium for storing data used in the above step of designing layout.

25 Claims, 12 Drawing Sheets

THREE-DIMENSIONAL MCM, METHOD FOR MANUFACTURING THE SAME, AND STORAGE MEDIUM STORING DATA FOR THE METHOD

BACKGROUND OF THE INVENTION

1. Field of the Invention

The present invention relates to a three-dimensional multichip module (MCM) and a semiconductor chip which can be used in this MCM. More particularly, the present invention relates to a technique for designing and manufacturing a semiconductor chip, such as a standard cell and an embedded array which can be used in an MCM, using computer-aided design (CAD). Further, the present invention relates to a storage medium for storing data used when design using CAD is carried out.

2. Description of the Related Art

Gate array, standard cell and embedded array are conventionally known methods for efficiently designing a semicustom LSI, as means for designing an Application Specific Integrated circuit (ASIC), which simply realizes a device for specific application using CAD.

A gate array is formed by preparing a master wafer beforehand, having transistors laid thereon in an array, and adding interconnections to the master wafer so as to produce a logic system. As shown in the example of FIG. 1, bonding pads (I/O pads) 101 are provided at the peripheral region of a chip, and a random logic block 102 is provided in the remaining region (central region) of the chip. In the random logic block 102, transistors are laid in an array.

However, a gate array architecture cannot be used to realize a large-scale macrocell such as a CPU or a memory. For this reason, a standard cell design methodology was introduced to simply realize a large-scale macrocell. To produce a standard cell, optimally designed and verified macrocells, registered beforehand in a CAD design database, are assembled in a predetermined layout using CAD. As shown in the example of FIG. 2, bonding pads 201 are provided at the peripheral region of the chip, and macrocells, comprising a CPU core 202, a RAM 203, a RAMBUS interface 204, a PLL 205 and a ROM 206, are provided in central region of the chip. These macrocells are directly connected to each other by interconnections.

The standard cell architecture enables large-scale macrocells to be formed easily, but has a disadvantage that the fabrication of each macrocell must start from the transistor unit level, or from the beginning of the fabrication process, lengthening development time.

Therefore, an embedded array architecture, in which standard cell macrocells are buried in the random logic block of a gate array, has been proposed.

This embedded array is manufactured after the number of gates and the types of macrocells to be contained within the random logic block have been decided. In other words, the embedded array is customised after the wafer process has been commenced but prior to the metallization process. In this state, completion of the logic design is awaited and, after a logic simulation has been carried out, the embedded array is completed by providing interconnections to the random logic block. As shown in the example of FIG. 3, bonding pads 301 are provided at the peripheral region of the chip, and macrocells comprising a CPU core 302, a RAM 303, a RAMBUS interface 304, a PLL 305 and a ROM 306, are provided in central region of the chip. In addition, a random logic block 307 is provided in order to realize the functions of these macrocells.

This embedded array comprises the random logic block, and therefore the customization of the embedded array do not need to be started from the transistor unit level. Consequently, time needed to develop the standard cell can be reduced. Moreover, changes to the circuits of the random logic block can dealt with simply by changing the interconnections.

However, on the conventional embedded array or the standard cell, no bump pads are prepared as the components of the cells for connecting to another chip directly above or below the embedded array or the standard cell. Then, when assembling an MCM with a chip fabricated by the conventional embedded array or the standard cell approach in combination with another pre-existing chip, these chips must be disposed in a side-by-side configuration, or two-dimensional configuration as shown in FIG. 4A and FIG. 4B.

FIG. 4A is a top view, and FIG. 4B, a side view. As shown in FIG. 4A and FIG. 4B, a chip 401 and a chip 402 are provided on a lead frame 400. Chip 401 is the conventional embedded array or the standard cell, and chip 402 is the pre-existing chip. Since it is not possible to stack the chips 401 and 402 three-dimensionally one above the other, they are arranged side by side on the lead frame 400. Then the right side bonding pads 403 on chip 401, and the left side bonding pads 404 on chip 402 are connected by bonding wires 407. And the left side bonding pads 403 on chip 401 and leads 406 are connected by bonding wires 405. Further, the right side bonding pads 404 on the chip 402 and leads 409 are connected by bonding wires 408.

The above structure, wherein multiple chips are two-dimensionally provided side by side, makes it impossible to reduce the area of the frame to less than the total area of the chips. As a result, the mounting area of the package cannot be made small.

Furthermore, the conventional MCM has a problem that electrical signals exchanged between the chips are delayed due to the long distance of the interconnections between the chips. As a consequence, it has been difficult to achieve high-speed executions with the conventional MCM. Furthermore, in a two-dimensional chip structure, it has been difficult to reduce noise generated by electrical signals exchanged between the chips.

SUMMARY OF THE INVENTION

The present invention has been achieved in order to solve the conventional problems described above and aims to provide a MCM of smaller scale.

It is another object of the present invention to provide a three-dimensional MCM using an ASIC, such as a standard cell or an embedded array, as a base chip.

It is yet another object of the present invention to provide a three-dimensional MCM wherein distance of interconnections between chips is short, delay of electrical signals exchanged between the chips is reduced, and high-speed behaviour is achieved.

It is yet another object of the present invention to provide a three-dimensional MCM in which noise generation of electrical signals exchanged between the chips is reduced.

It is yet another object of the present invention to provide an ASIC, such as a high general versatility standard cell or embedded array, which can be easily assembled in a three-dimensional MCM.

It is yet another object of the present invention to provide a manufacturing method whereby a small-scale high-speed high-performance three-dimensional MCM, which uses a standard cell as the base chip, can be easily designed and manufactured.

It is yet another object of the present invention to provide a manufacturing method whereby a small-scale high-speed high-performance three-dimensional MCM, which uses an embedded array as the base chip, can be easily designed and manufactured.

It is yet another object of the present invention to provide a storage medium for storing data needed for designing layout and the like of a macrocell, a bump pad and interconnections, and to easily and quickly manufacture a three-dimensional MCM which uses a standard cell as a base chip.

It is yet another object of the present invention to provide a storage medium for storing data needed for designing layout and the like of a macrocells, a random logic block and a bump pad, and to easily and quickly manufacture a three-dimensional MCM which uses an embedded array as a base chip.

In order to achieve the above objects, a multichip module (MCM) comprising a three-dimensional structure, wherein a base chip and an external chip are connected by a bump, constitutes a first aspect. In other words, the first aspect of the present invention is an MCM comprising: a base chip having: a bonding pad provided at a peripheral region thereof; an internal circuit containing macrocells provided in and at proximity to a central region of the base chip; and a bump pad provided at proximity to the central region except over the internal circuit; a bump provided on the bump pad; and an external chip to be attached three-dimensionally with the base chip via the bump.

According to the first aspect of the present invention, a base chip, comprising an IC such as a standard cell or an embedded array, can be easily electrically connected to an external chip, enabling the package to be made small-scale. The silicon on silicon-type MCM of the first aspect of the present invention enables the distance of interconnections between the chips to be shortened and reduces delay of signals exchanged between the chips. As a consequence, high-speed performances can be achieved. Furthermore, it is possible to reduce noise generated by the exchange of signals between the chips.

A second aspect of the present invention relates to a base chip which can be used in the MCM according to the first aspect. In other words, the second aspect of the present invention comprises a base chip having a bonding pad provided at a peripheral region of the base chip; an internal circuit containing macrocells provided in and at proximity to a central region of the base chip; and a bump pad provided at proximity to the central region except above the internal circuit. 'Can be used in the MCM' means the base chip can be used as a single unit depending on design specifications.

By using the base chip of the second aspect of the present invention, when designing a system it is possible to freely select whether to three-dimensionally assemble the base chip with an external chip so as to form an MCM, or to use the base chip as a single unit. Particularly, when the base chip is assembled in an MCM, the scale of the package can be made smaller than a two-dimensional package. When assembled as a silicon on silicon-type MCM, the distance of interconnections between the chips can be shortened and delay of signals exchanged between the chips can be reduced. Consequently, high-speed performances can be achieved. Furthermore, it is possible to reduce noise generated by the exchange of signals between the chips. Since the base chip can be freely used as a single unit or assembled as an MCM, general versatility is higher.

A third aspect of the present invention provides a method for manufacturing a three-dimensional MCM comprising the steps of preparing and storing macrocell cell information and said bump pad cell information, logic designing, designing layout, fabricating a mask pattern, fabricating a standard cell and assembling. Here, in the step of logic designing, a standard cell, comprising verified macrocells based on a system specification defining various design conditions relating to the standard cell, is logically designed. In the step of designing layout, the layout of the macrocells, bump pads and interconnections on a basechip are designed using the result of the logic design, the cell information of the macrocell and the bump pad. In the step of fabricating a mask pattern, a mask pattern is made based on the result of the step of designing layout. In the step of fabricating the standard cell, the standard cell is fabricated on the basechip using the mask pattern. And, in the step of assembling, an external chip and the basechip are three-dimensionally assembled via bumps provided on the bump pads, thereby connecting the external chip to the basechip.

According to the third aspect, a standard cell which can be used as a base chip in a silicon on silicon-type MCM can be easily designed and manufactured. Therefore, an MCM using the standard cell can be easily manufactured.

A fourth aspect of the present invention provides a method for manufacturing a three-dimensional MCM comprising the steps of preparing a system specification, preparing cell information of a bump pad capable of directly connecting a embedded array to an external chip to be stacked in a vertical direction, logic designing, designing layout, fabricating a mask pattern for a master wafer, fabricating a master wafer, designing interconnections, fabricating a metallization mask pattern, metallizing and assembling. Here, the system specification defines various design conditions relating to the embedded array having verified macrocells and a random logic block for realizing functions of the macrocells. In the step of logic designing, an embedded array is logically designed based on the system specification and the cell information. In the step of designing layout, layout is designed of at least the macrocell, the random logic block and the bump pad, at predetermined positions on a basechip in which the embedded array is integrated, based on the system specification and a result of the step of logic designing. In the step of fabricating a mask pattern, a mask pattern for a master wafer is made in correspondence with a layout result of the step of designing layout. In the step of fabricating a master wafer, a master wafer is fabricated on the basechip using the mask pattern. In the step of designing interconnections, interconnections on the random logic block is designed using the result of the step of logic designing and the result of the step of designing layout. In the step of fabricating a metallization mask pattern, a metallization mask pattern is made using the result of the step of designing interconnections. In the step of metallizing, metallization is carried out on the master wafer using the metallization mask pattern. And, in the step of assembling, the external chip and the basechip are three-dimensionally assembled via a bump provided on the bump pad.

According to the fourth aspect, the embedded array which can be used as the base chip in a silicon on silicon-type MCM can be easily designed and manufactured. Therefore, an MCM using the embedded array can be easily manufactured.

A fifth aspect of the present invention relates to a storage medium, which can be read out by computer, storing data used in the manufacturing method of the three-dimensional MCM of the third aspect. In other words, the fifth aspect of the present invention is a storage medium, which can be read out by computer, storing data comprising a first data file and a second data file. Here, the first data file comprises: a verified macrocell cell information storage region; a bump pad cell information storage region for storing cell information of a bump pad for forming a three-dimensional multi-chip module by means of a bump. And, the second data file comprises a logic design result storage region for storing the result of logic design which has been conducted using the first data file.

When these types of data files are prepared, in the step of designing layout of the above third aspect, it is possible to automatically and easily determine the layout of the macrocells, the bump pad and the interconnections on the base chip, by using a first data file, storing cell information relating to the macrocells and cell information relating to the bump pad, and a second data file, storing the result of the logic design. Here, 'storage medium' refers to a device capable of storing program such as, for instance, a semiconductor memory, a magnetic disk, an optical disk , an optical magnetic disk , a magnetic tape and the like. More specifically, it refers to a floppy disk, a CD-ROM, an MO disk, a cassette tape, an open-reel tape and such like.

A sixth aspect of the present invention relates to a storage medium, which can be read out by computer, storing data used in the manufacturing method of the three-dimensional MCM of the fourth aspect. In other words, the sixth aspect of the present invention is a storage medium, which can be read out by computer, storing data comprising a first data file and a second data file. Here, the first data file comprises: a cell information storage region for storing cell information of verified macrocells; a random logic block cell information storage region for storing cell information of a random logic block for executing functions of the macrocells: and a bump pad cell information storage region for storing cell information of a bump pad for forming a three-dimensional multi-chip module. And, the second data file comprises: a storage region for storing a floor plan of an embedded array; a layout storage region for storing layout of the macrocell, the random logic block and the bump pad using the first data file; and a logic design result storage region for storing the result of logic design which has been conducted, using the first data file.

When these types of data files are prepared, in the step of designing layout of the fourth aspect, it is possible to automatically and easily determine the layout of the macrocells, the random logic block and the bump pad on the base chip, by using a first data file, storing cell information relating to the macrocells and the random logic block as well as cell information relating to the bump pad, and a second data file, storing user data including the system specification. Furthermore, when the layout result of the step of designing layout is stored in the second data file in addition to the logic design result of the step of logic designing in the above fourth aspect, it is possible to use the stored layout result and the stored logic design result in the step of designing interconnections on the random logic block in the fourth aspect, whereby the metallization on the master wafer can be performed easily. Therefore, an embedded array which can be used as a base chip in a silicon on silicon-type MCM can be easily formed. Here, 'storage medium' refers to a device capable of storing program such as, for instance, a semiconductor memory, a magnetic disk, an optical disk, an optical magnetic disk, a magnetic tape and the like. More specifically, it refers to a floppy disk, a CD-ROM, an MO disk, a cassette tape, an open-reel tape and such like.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Figure 1:
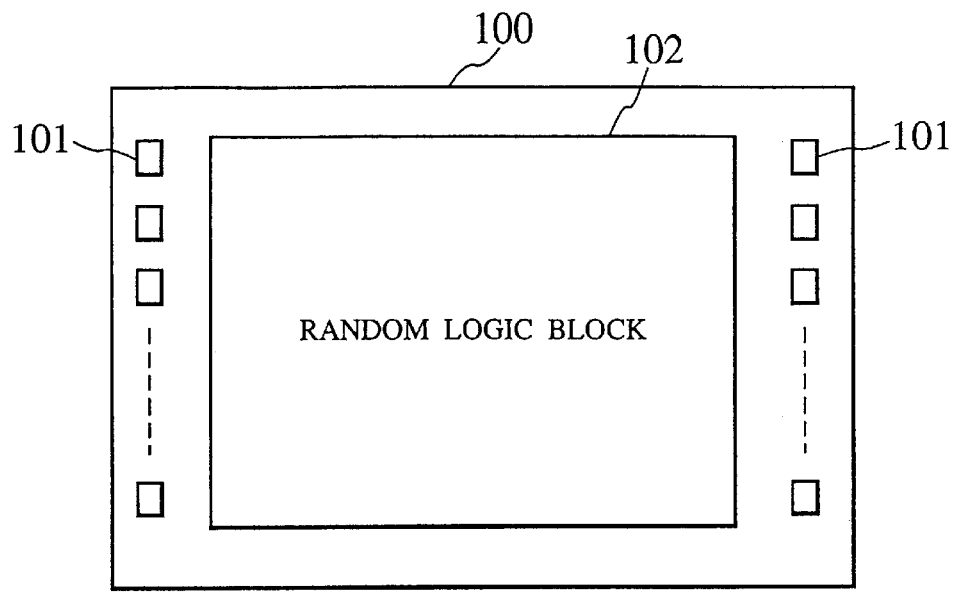
FIG. 1 is a diagram showing a configuration of a gate array.
Figure 2:
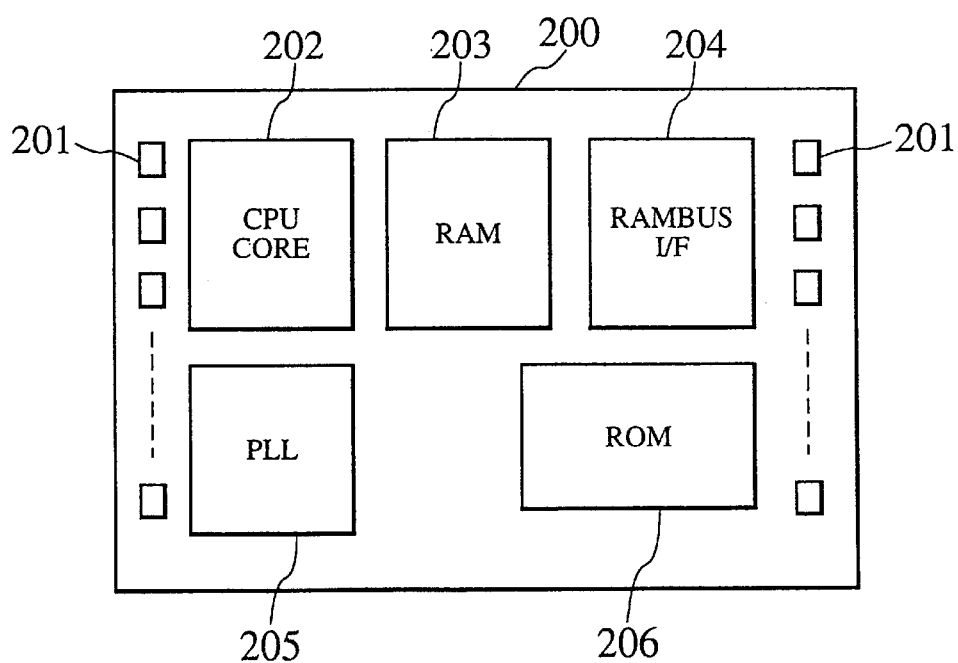
FIG. 2 is a diagram showing a configuration of a standard cell.
Figure 3:
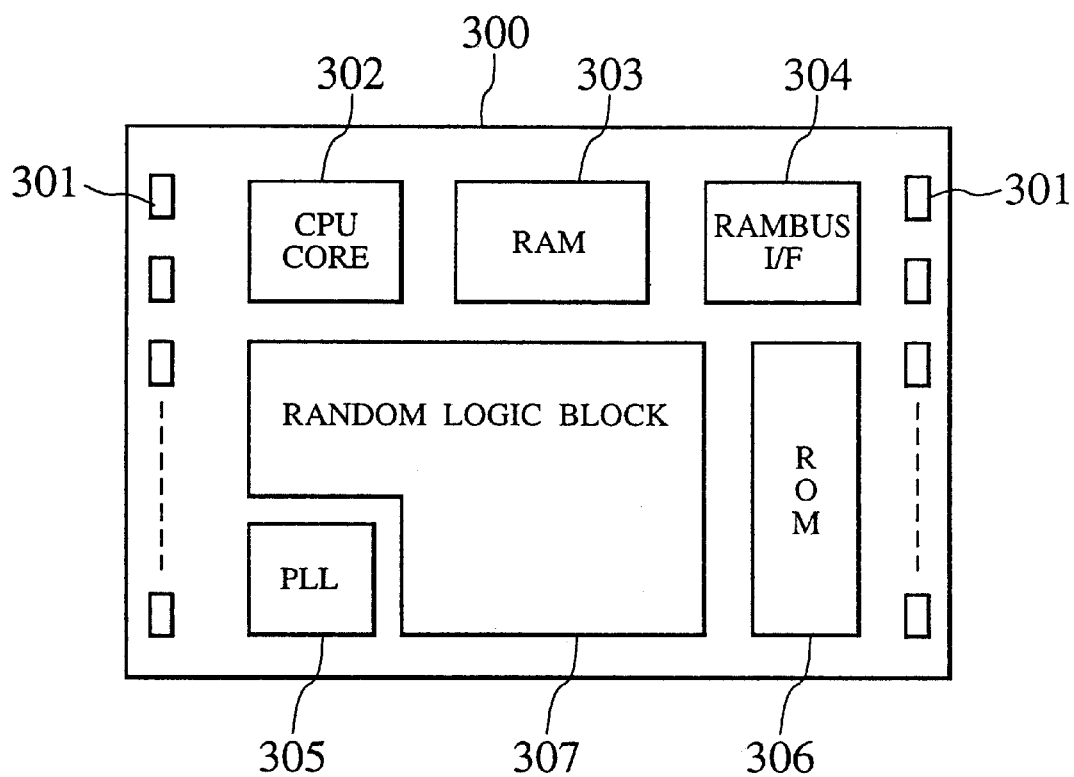
FIG. 3 is a diagram showing a configuration of an embedded array.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(FIRST EMBODIMENT)

Figure 5A:
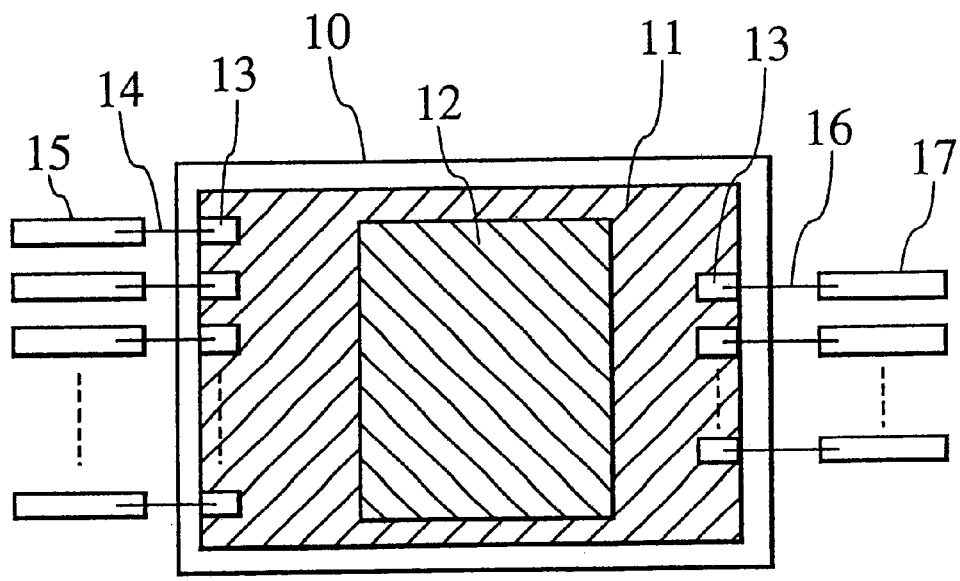
FIG. 5A is a top view of the outside of the MCM of the present invention, and FIG. 5B, a side view of the same.
Figure 5B:
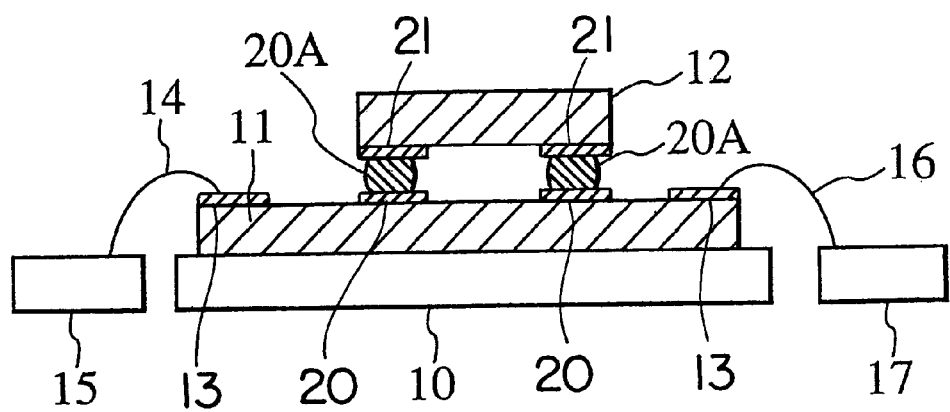

FIG. 5A shows top view of a three-dimensional MCM according to a first embodiment of the present invention, and FIG. 5B is a side view of the three-dimensional MCM. As shown in FIG. 5A and FIG. 5B, this three-dimensional MCM is a silicon on silicon-type MCM, wherein a base chip 11 is mounted and secured on a lead frame 10 and a pre-existing chip 12 is attached above the base chip 11 with bumps 20A.

The base chip 11 comprises an embedded array or a standard cell, on which is formed bump pads 20 of the present invention (see FIG. 7), and is manufactured according to a designing and manufacturing method explained later. The bump pad 20 of the present invention is provided on the base chip 11 in a position so as to correspond with the bump pad position 21 of the pre-existing chip 12, provided on top. The respective bump pads 20 on the base chip 11 are electrically connected to the corresponding bump pads 21 on the pre-existing chip 12 by bumps 20A between the base chip 11 and the pre-existing chip 12.

Further, bonding pads (I/O pads) 13, provided at the peripheral region of the base chip 11, connect to leads 15 and 17 via bonding wires 14 and 16 respectively.

Figure 6:
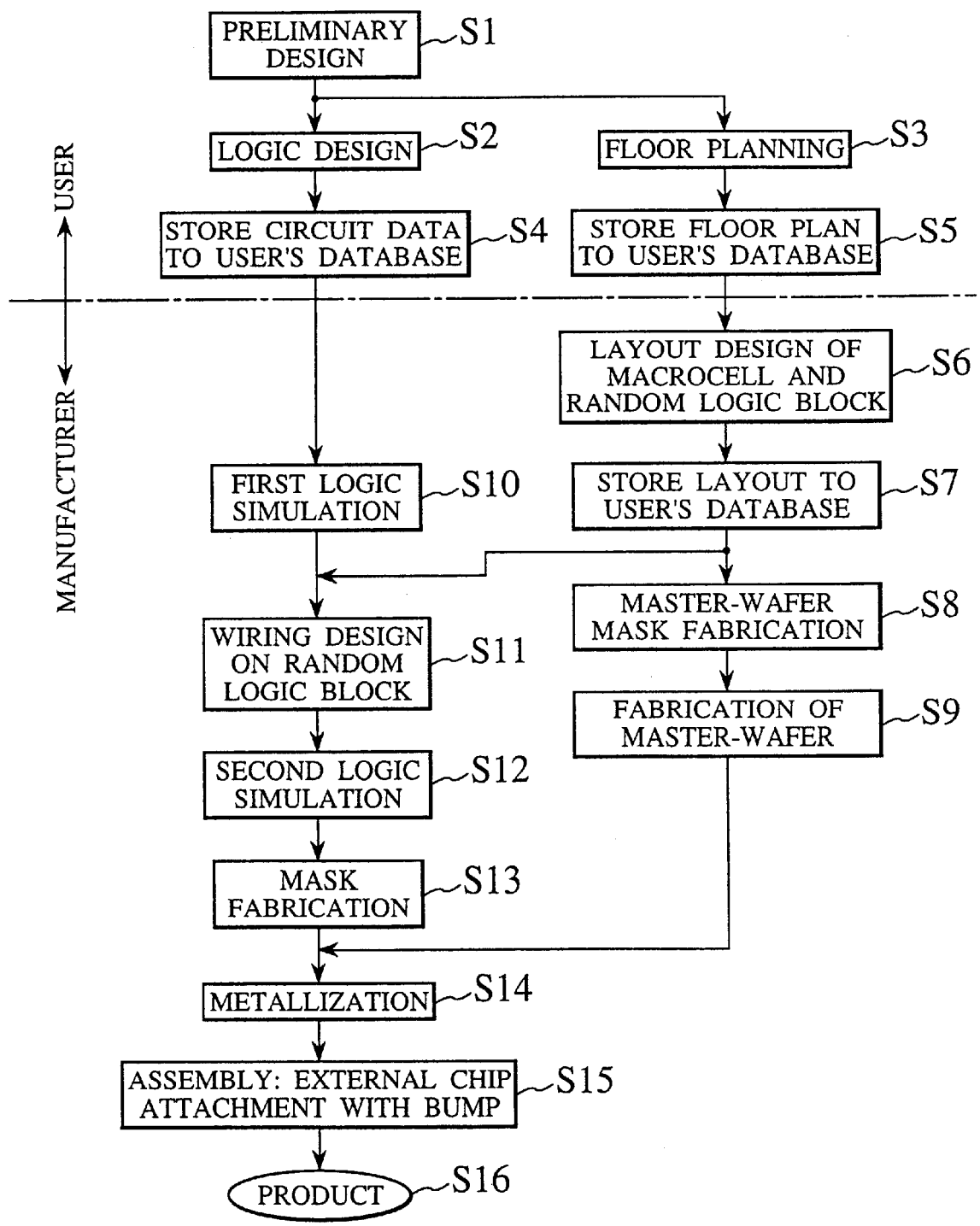
FIG. 6 is a flowchart illustrating a method for designing and manufacturing a three-dimensional MCM which uses an ASIC (embedded array) according to a first embodiment of the present invention.

Next, referring to FIGS. 6 to 8, a method for manufacturing a three-dimensional MCM according to the present invention will be explained, focusing on a method for designing the base chip 11 comprising an embedded array. FIG. 6 is a flowchart illustrating a manufacturing method whose principal object is to design a three-dimensional MCM using an ASIC (embedded array).

In the embedded array methodology of the first embodiment, cells (such as a macrocell and a random logic block, in addition to the bump pad of the present invention) for realizing various types of functions, are registered and stored in a CAD design database. And, a list of the registered cells and data for guaranteeing performance, electrical characteristics and functionality are disclosed to the user to be used as a data book. Then, the user can acquire a silicon on silicon-type MCM, such as the one shown in FIG. 5A and FIG. 5B, drawing up a desired circuit diagram based on this data and issuing an order to the manufacturer for product development and production. The manufacturer, after specifying the layout positions of some of the cells as necessary, automatically designs a mask pattern using CAD in accordance with the circuit diagram specified by the user and develops the product.

This will be explained more specifically. Firstly, in a preliminary design step S1, the user determines an outline of the design of a system specification and the like defining all types of design conditions (such as essential design points) relating to the embedded array. Then, the process shifts to a logic design step S2, while simultaneously, a floor planning step S3 is carried out. In the logic design step S2, the LSI is concretized to a predetermined level based on the system specification of step S1, and the circuit diagram desired by the user is created. In step S4, the circuit data resulting from this logic design is stored in a user database 31 (second data file). In the floor planning of step S3, the user indicates the types of macrocells to be contained, the number of gates in the random logic block, the number of pins and the like. In step S5, the items determined in this floor planning are stored in the user's database 31 (second data file).

In step S6, the manufacturer first designs the layout of the macrocell and the random logic block, making free use of CAD. In other words, cell information for a verified CPU core 41, a RAM 42, a RAMBUS interface 43, a PLL44 and a ROM 45, which comprise the macrocells for realizing the embedded array of the first embodiment of the present invention, is stored in the CAD layout database 30 (first data file) shown in FIG. 7. Moreover, cell information for the random logic block 46 (which, like the gate array, has no metal layers) needed in order to realize the functions of these macrocells and cell information for the bump pads of the present invention are also stored.

Figure 7:
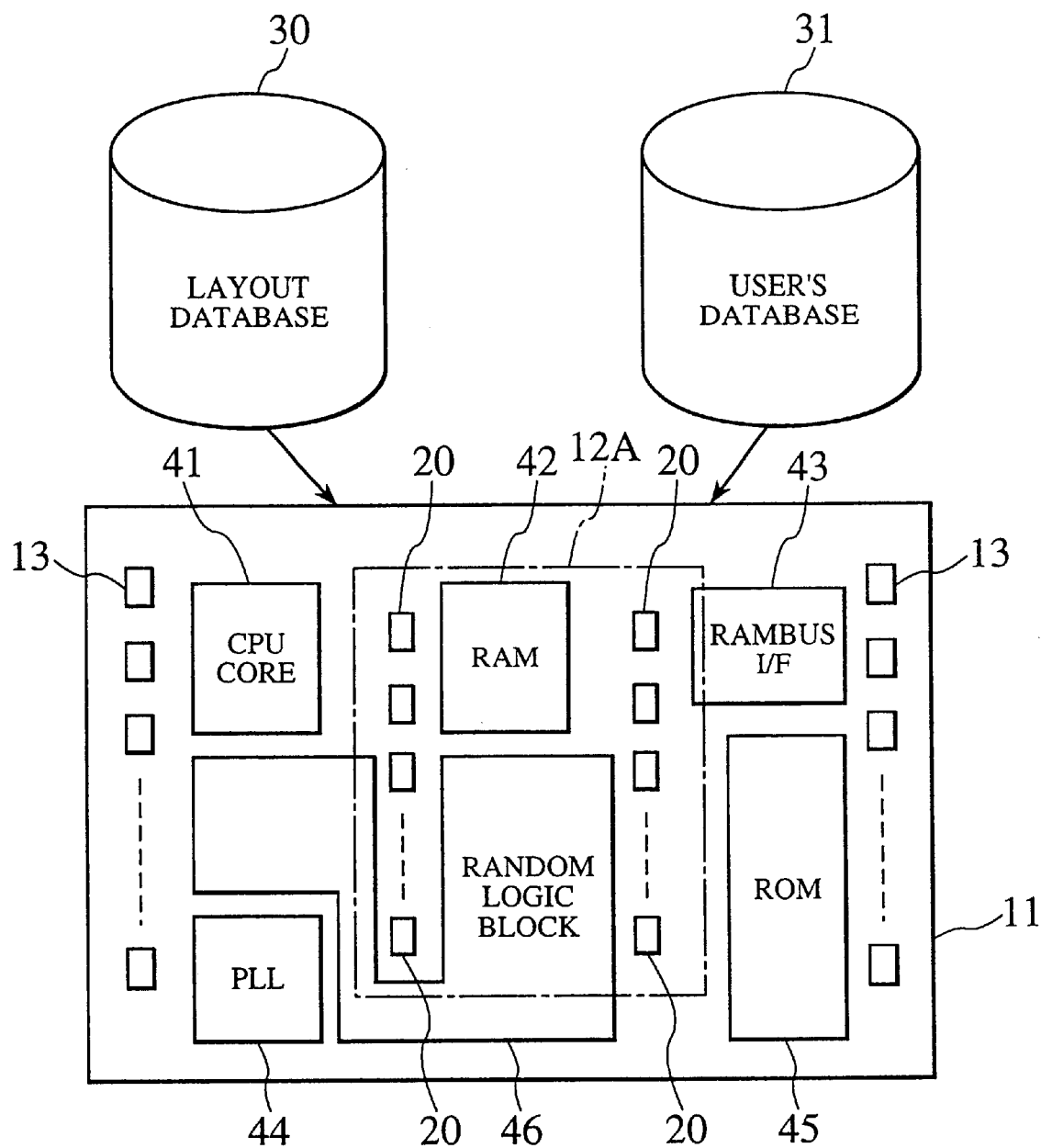
FIG. 7 is a diagram showing a layout step using CAD according to the first embodiment.

As for instance shown in FIG. 7, layout of the CPU core 41, the RAM 42, the RAMBUS interface 43, the PLL44, the ROM 45, the random logic block 46 and the bump pads 20 of the present invention is carried out by the manufacturer. Thus, in step S6, the manufacturer determines the allocation of the macrocells and the random logic block which comprise the base chip 11 in the MCM. Although not shown in the diagram, an I/O regions are connected to the bonding pads 13. And, region 12A, indicated by a dot-dashed line in FIG. 7, shows the region of the pre-existing chip 12 to be provided above the base chip 11. In step S7, the layout result is stored in the user's database 31.

In step S8, a mask pattern for the master wafer is faricated based on the layout result of step S6. In step S9, the master wafer is fabricated by a conventional wafer fabricating process using this mask pattern. In this way, the manufacturer proceeds with manufacturing to the point prior to the metallization process of the random logic block 46.

Meanwhile, when the user has completed the logic design (step S2), the manufacturer carries out a first logic simulation (step S10). However, this simulation may sometimes be carried out by the user.

Next, in step S11, the manufacturer freely uses CAD to design the layout of wiring (interconnections) on the remaining portion of the base chip, namely on the random logic block 46, using the circuit data and the layout result stored in the user database 31. After this wiring layout design is completed, a second logic simulation, i.e. a further detailed simulation is carried out to reliably check the operation (step S12).

Then, a wiring mask pattern is fabricated (step S13) based on the result of wiring design on the random logic block 46. In step S14, the metallization process using, for example, sputtering or vacuum evaporation photolithography using the wiring mask pattern fabricated in step S13, and reactive ion etching (RIE) is performed to form interconnections on the master wafer fabricated in step S9 described above. Then passivation film is deposited on the interconnections. Next, in step S15, assemble process is performed: for example, the master wafer is cut into base chips (dice) with diamond blade, each base chip (die) is mounted on the lead frame 10 (See FIG. 5B), and an external chip 12 is attached above the base chip 11 using the bumps 20A, thereby completing the three-dimensional MCM having an embedded array of the present invention as the base chip. Thus the product of the first embodiment is provided (step S16).

The embedded array of the first embodiment of the present invention serves as the base chip 11 of MCM, and is characterized in that bump pads 20 are registered in the cell library and automatically designed on the base chip 11 so that it can be electrically connected with the pre-existing chip 12 through bumps 20A. In the conventional MCM shown in FIGS. 4A and 4B, among the bonding pads 403 on the chip 401, fulfilling the function of the base chip of the first embodiment of the present invention, those right side bonding pads 403 which connect to the left side bonding pads 404 on the chip 402 correspond to the bump pads 20 of the present invention. In this case, as shown in FIG. 8, in the first embodiment of the present invention, the bump pad 20 is connected to an I/O buffer cell 51 at the peripheral region of the chip by a thick wire 50 which has high current-handling capability. The width of the thick wire 50 may, for example, 10 to 100 $\mu$m: the line width is determined by design specifications. Another small signal wire 52, having width less than 1 $\mu$m for example, connects the I/O buffer cell 51 to an internal circuit (a general term for the macrocell and the random logic block) 53.

Figure 4A:
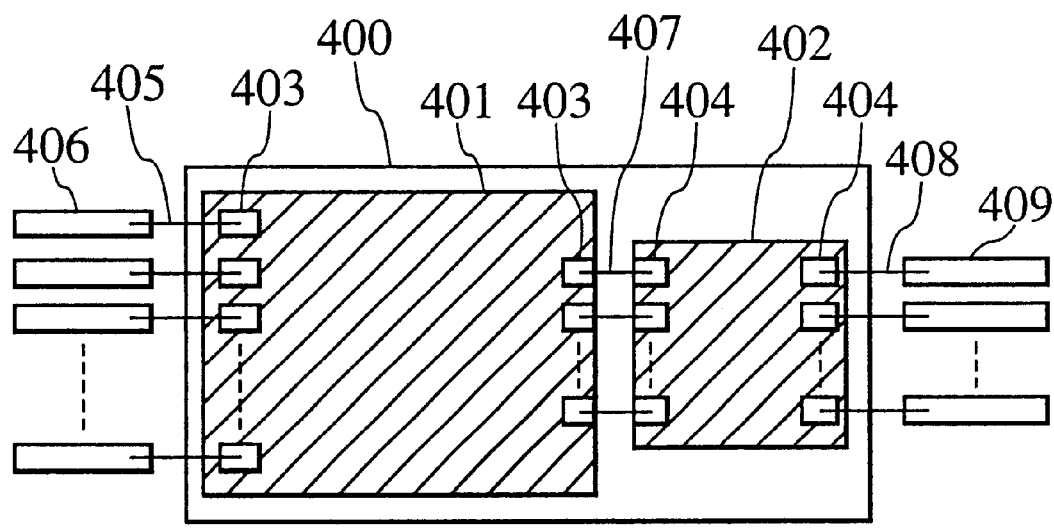
FIGS. 4A and 4B are diagrams showing a configuration of a conventional MCM.
Figure 4B:
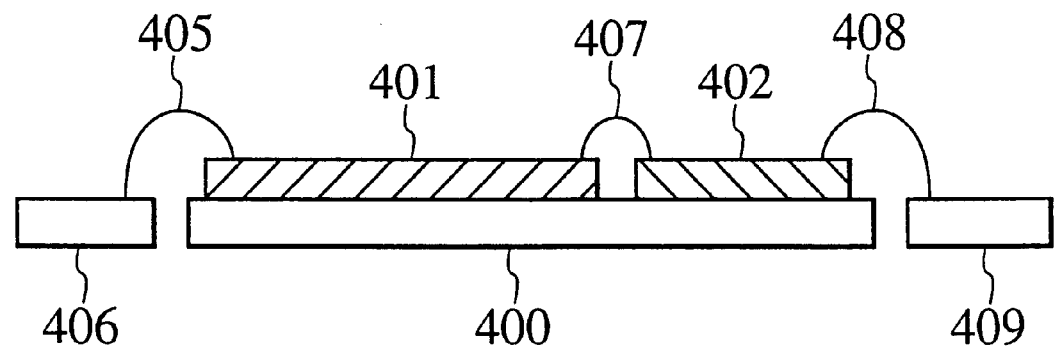

Furthermore, in the conventional MCM shown in FIGS. 4A and 4B, the right side bonding pads 404 on the chip 402 and leads 409 are connected by bonding wires 408. However, in the MCM of the present invention, the right side bonding pads 404 is changed to bump pads on the chip 402, and currents from the chip 402 passes through the bumps 20A to bump pads 20 on the embedded array, which forms the base chip 11, and are then flow toward leads 17 via bonding pads 13 of the base chip 11 and bonding wires 16.

Furthermore, in the conventional MCM shown in FIGS. 4A and 4B, the left side bonding pads 403 on chip 401 and leads 406 are connected by bonding wires 405. However, in the MCM of the present invention, this left side bonding pads 403 are replaced by bonding pads 13 on the embedded array 11, the bonding pads 13 are connected to the leads 15 by bonding wires 14.

Thus, focusing on the design automation technology of embedded array, the first embodiment of the present invention prepares the cell information for bump pads 20, storing the cell information for bump pads 20 as a registered cell library, and the bump pads 20 can be allocated automatically on the embedded array in positions matching the bump pad positions of the pre-existing chip 12, thereby enabling the embedded array to act as a base chip 11 and making it possible to assemble the MCM with the silicon on silicon structure. Consequently, it is possible to realize the MCM with a smaller-scale frame, reducing the mounting area.

(SECOND EMBODIMENT)

In a second embodiment of the present invention, a standard cell is used as the base chip 11 of the MCM instead of the embedded array.

Figure 9:
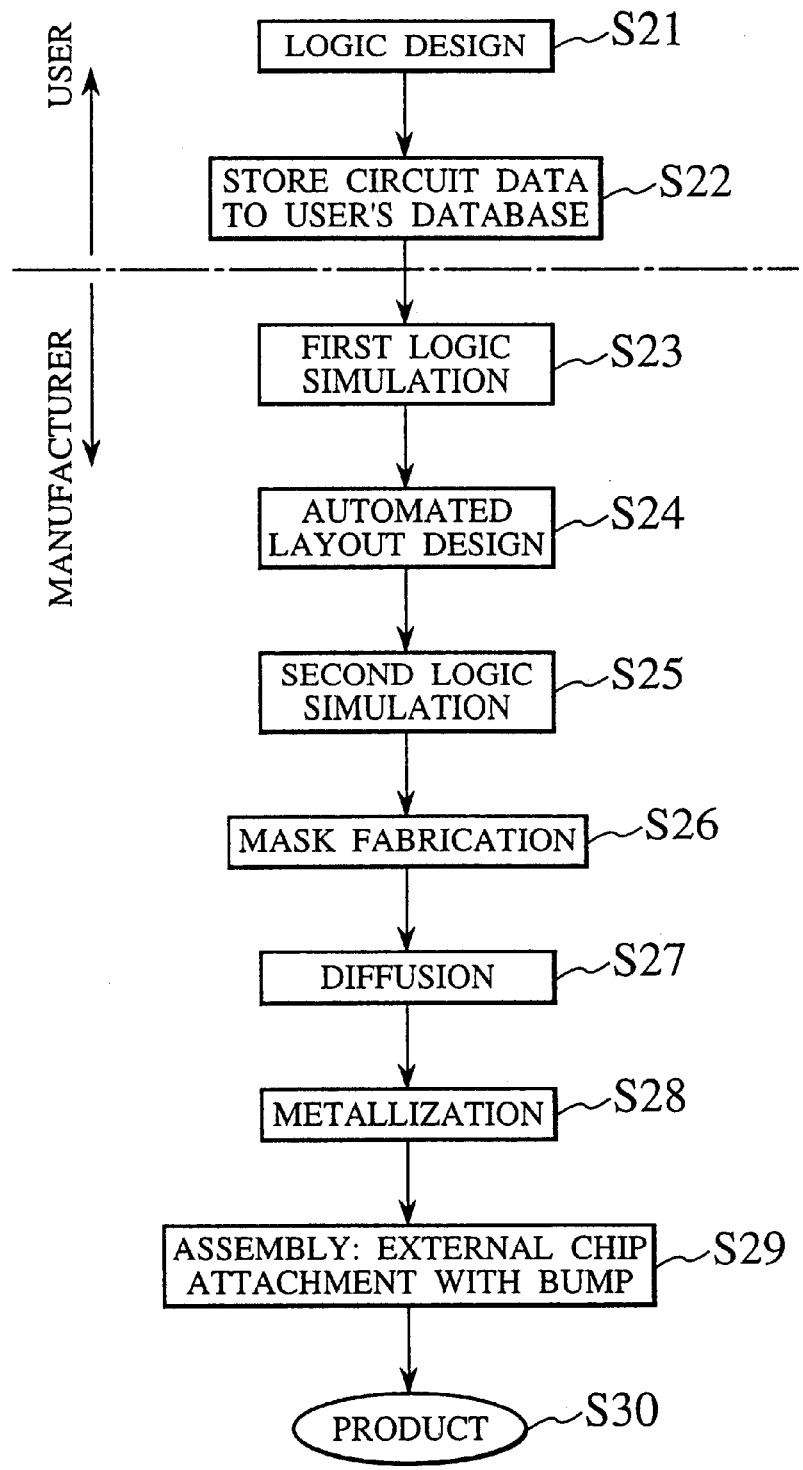
FIG. 9 is a flowchart illustrating a method for designing and manufacturing a three-dimensional MCM which uses an ASIC (standard cell) according to a second embodiment of the present invention.

FIG. 9 is a flowchart of a method for manufacturing a three-dimensional MCM according to the second embodiment of the present invention, principally illustrating a method for designing an MCM using an ASIC (standard cell) as the base chip.

Firstly, in step S21, the user performs logic design based on a system specification defining all types of design conditions (such as essential design points) relating to the standard cell. In step S22, the circuit data resulting from this logic design is stored in a user's database 31 (second data file).

When the user has completed logic design, the manufacturer carries out a first logic simulation (step S23).

Figure 10:
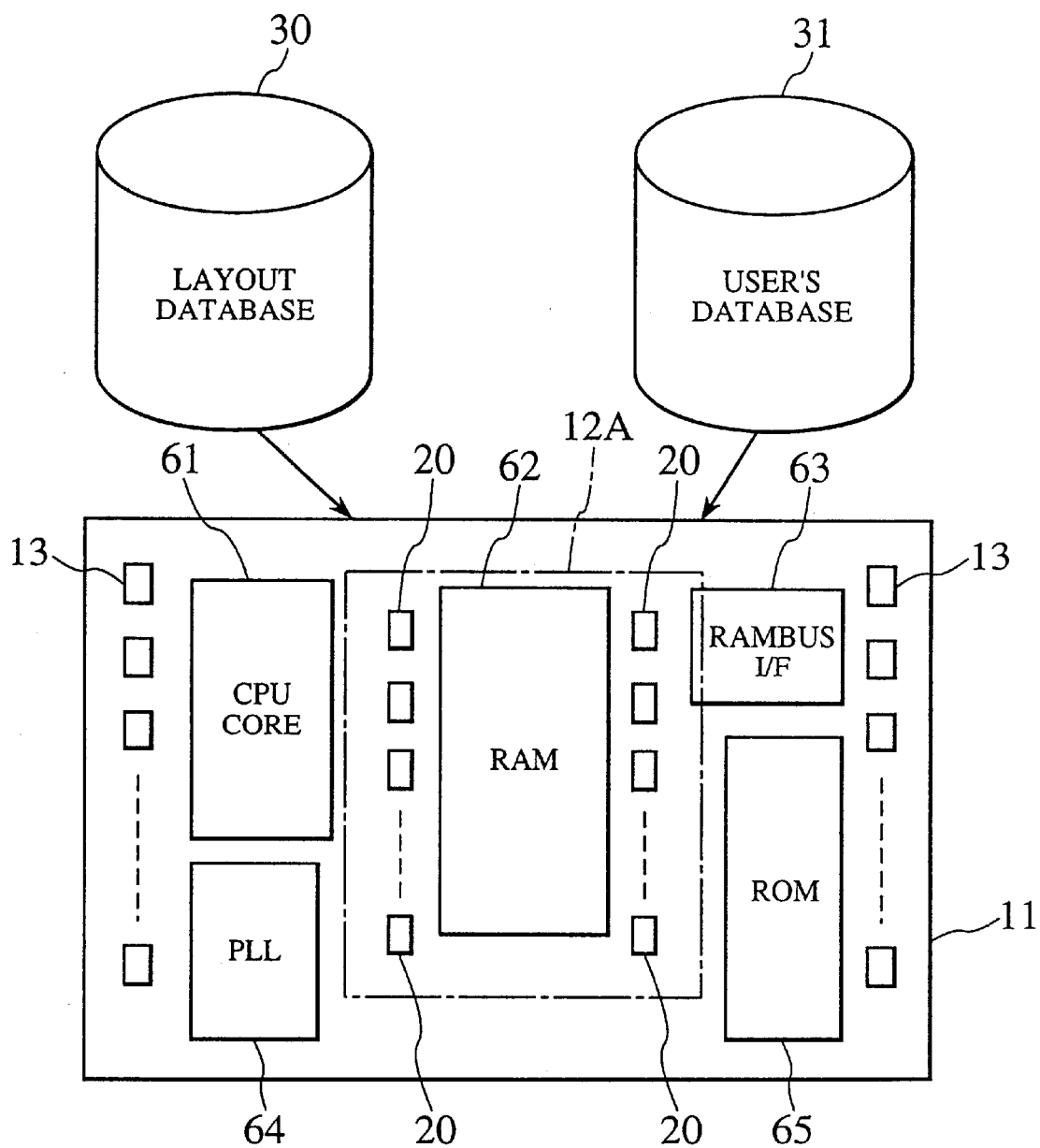
FIG. 10 is a diagram showing a layout step using CAD according to the second embodiment.

In the second embodiment of present invention, the cell information for an optimally designed and verified CPU core 61, a RAM 62, a RAMBUS interface 63, a PLL64 and a ROM 65, which form the macrocell for realizing the standard cell, is stored in the CAD layout database 30 (first data file) shown in FIG. 10. In addition, cell information for the bump pad of the present invention is also stored in this CAD layout database 30. Then, in step S24, the manufacturer designs the layout of the standard cell, making free use of CAD technology with database stored in the layout database 30 (first data file). Then, the layout of the CPU core 61, the RAM 62, the RAMBUS interface 63, the PLL64, the ROM 65 and the bump pad 20 of the present invention is automatically designed.

After the layout has been automatically designed, a second simulation, or a further detailed simulation is carried out to reliably check the operation (step S25). Then, a mask pattern is fabricated based on the result of the automatically designed layout (step S26). Then wafer process comprising specified sequences of processing steps including ion implantation, diffusion, oxidation, CVD, etching, photolithography using the mask pattern fabricated in step S26 is conducted (step S27). In step S28, the metallization process using, for example, sputtering or vacuum evaporation photolithography using the wiring mask pattern fabricated in step S26, and reactive ion etching (RIE) is performed to form interconnections on the wafer fabricated in step S27. Then passivation film is deposited on the interconnections. Next, in step S29, assemble process is performed. Namely, the wafer is cut into base chips (dice) with diamond blade etc., each base chip (die) is mounted on a lead frame, and an external chip is attached above the base chip using the bumps, thereby completing the three-dimensional MCM having the standard cell as the base chip. Thus the product of the second embodiment is provided (step S30).

As in the first embodiment already described, the standard cell of the second embodiment of the present invention, manufactured as explained above, is characterized in that bump pads are registered in the cell library and automatically designed on the base chip: the bump pads are automatically provided on the base chip of the MCM. Then, it is easy to be electrically connected to a pre-existing chip (external chip) stacked on top of the base chip, thereby offering the same advantages as the first embodiment.

(THIRD EMBODIMENT)

Figure 11:
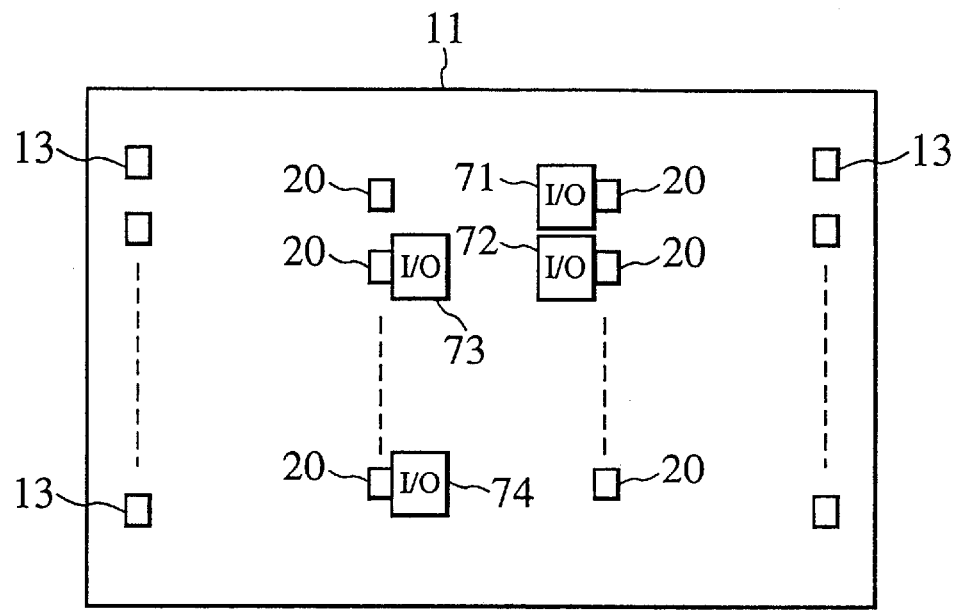
FIG. 11 is a diagram showing primary parts of a base chip in a three-dimensional MCM according to a third embodiment of the present invention.

FIG. 11 is a diagram showing the configuration of primary parts of a base chip in an MCM according to a third embodiment of the present invention. The third embodiment of the present invention features bump pads, each having input/output buffer cells, are formed on the base chip for the three-dimensional MCM, where the bump pads are those mentioned in the first and second embodiments. The input/output buffer cells are provided adjacent to the bump pads.

In the third embodiment of the present invention, the bump pad by itself, the bump pad with input buffer cell, the bump pad with output buffer cell and the bump pad with input/output buffer cell are registered and stored in the CAD layout database (first data file), and the respective bump pads can be allocated automatically on the embedded array or standard cell in positions matching the bump pad positions of a pre-existing chip, thereby enabling the embedded array or standard cell to act as a base chip and making it possible to assemble the MCM such as the silicon on silicon structure. In other words, the embedded array or standard cell of high design efficiency can be automatically designed as the base chip of the three-dimensional MCM.

In the example shown in FIG. 11, input/output buffer cells 71 to 74 are provided on the base chip 11.

Figure 8:
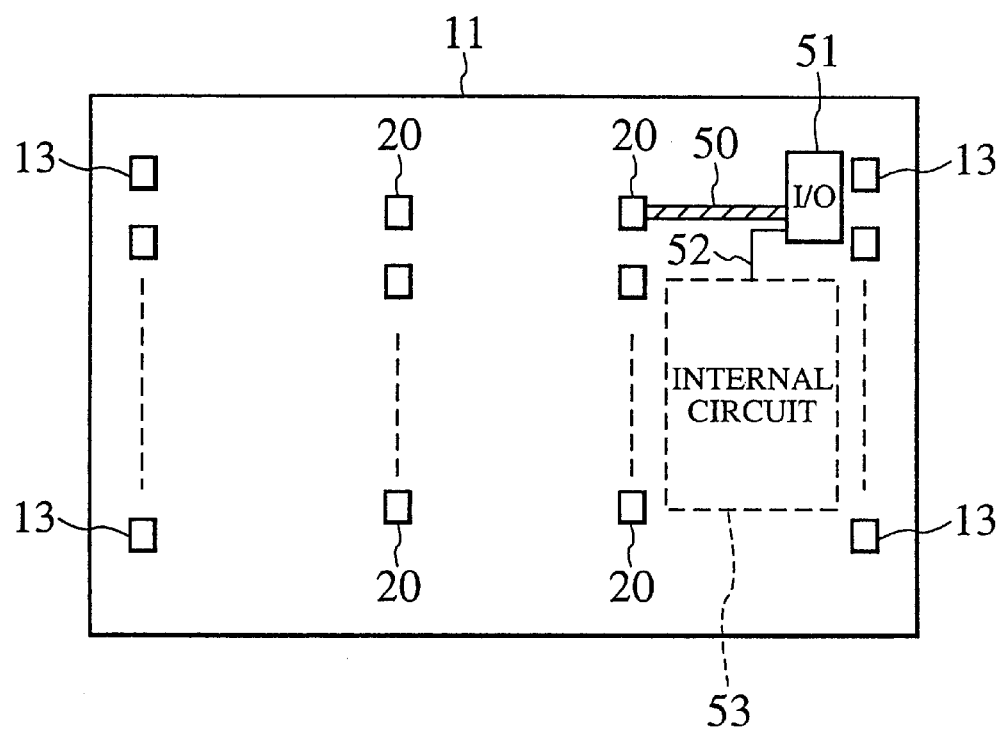
FIG. 8 is a diagram showing an interconnection between a bump pad and an internal circuit in the first embodiment.
Figure 12:
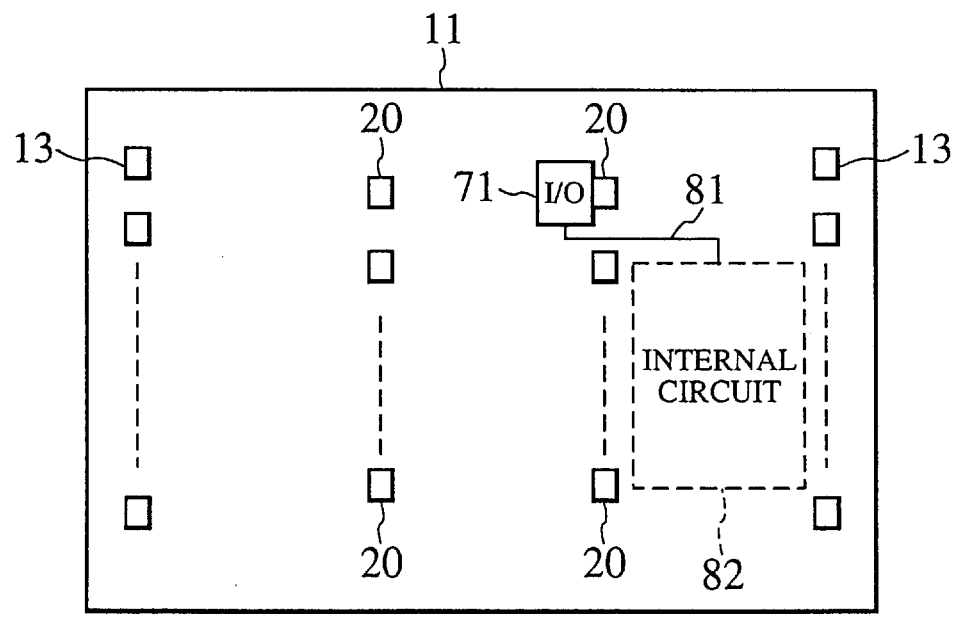
FIG. 12 is a diagram showing an interconnection between a bump pad and an internal circuit in the third embodiment.

In the first embodiment shown in FIG. 8, firstly, a signal (or current) from the pre-existing chip 12 passed via the bump pad 20 along a thick wire (first wire) 50 and was input into the I/O buffer cell 51 at the peripheral region of the chip. Next, the signal(or current) flowed from the I/O buffer cell 51 along a thin wire 52, and finally, input to an internal circuit 53 of the base chip 11. In the third embodiment of the present invention, the input/output buffer cells 71 to 74 are provided next to the bump pads 20. Consequently, as shown in FIG. 12, the signal from the pre-existing chip 12 passes directly to the input/output buffer cell 71 and is then input, along a small signal wire (second wire) 81 having a minute line width, to an internal circuit 81 of the base chip 11. As a result, the large current-handling capability wire 50 shown in FIG. 8 can be dispensed with, or shortened, and the pre-existing chip 12 can be connected to the internal circuit 82 of the base chip 11 by the small signal wire 81. As a consequence, the large current-handling capability wire 50, which requires a large area, can be reduced, whereby the chip size can be made small. Moreover, signal delay and noise can be reduced.

(OTHER EMBODIMENTS)

Various modifications will become possible for those skilled in the art after receiving the teachings of the present disclosure without departing from the scope thereof.

Figure 13A:
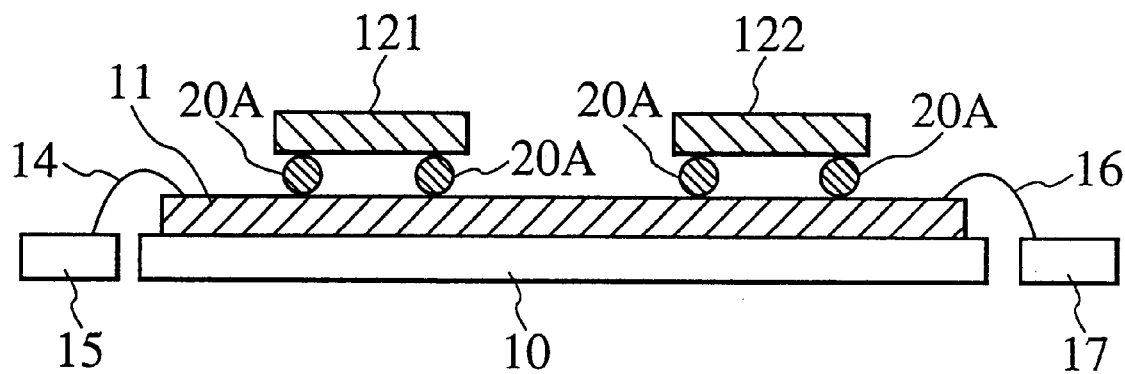
FIG. 13A and FIG. 13B are side views of the outside of a three-dimensional MCM according to other embodiments of the present invention.
Figure 13B:
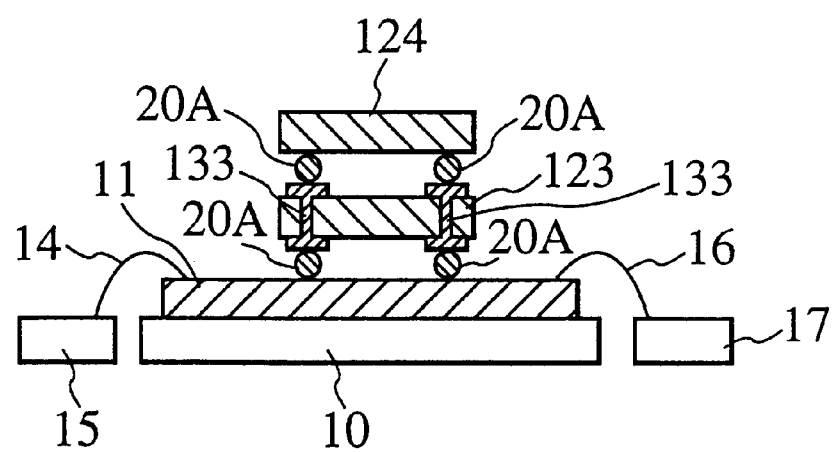

For instance, embodiments 1 to 3 described examples where a single external chip was mounted on the base chip 11, but as shown in FIG. 13A, multiple external chips 121 and 122 may be mounted. Furthermore, as shown in FIG. 13B, the external chips 123 and 124 may be stacked in vertical layers using bumps 20A. In FIG. 13B, via holes are provided running through the external chip 123 from the top face to the bottom face. Via hole metals 133 buried in these via holes connects the bumps 20A above and below. When this type of via hole metal is used, the external chip 12 shown in FIG. 5B does not have to be assembled with the flip-chip configuration.

Figure 14:
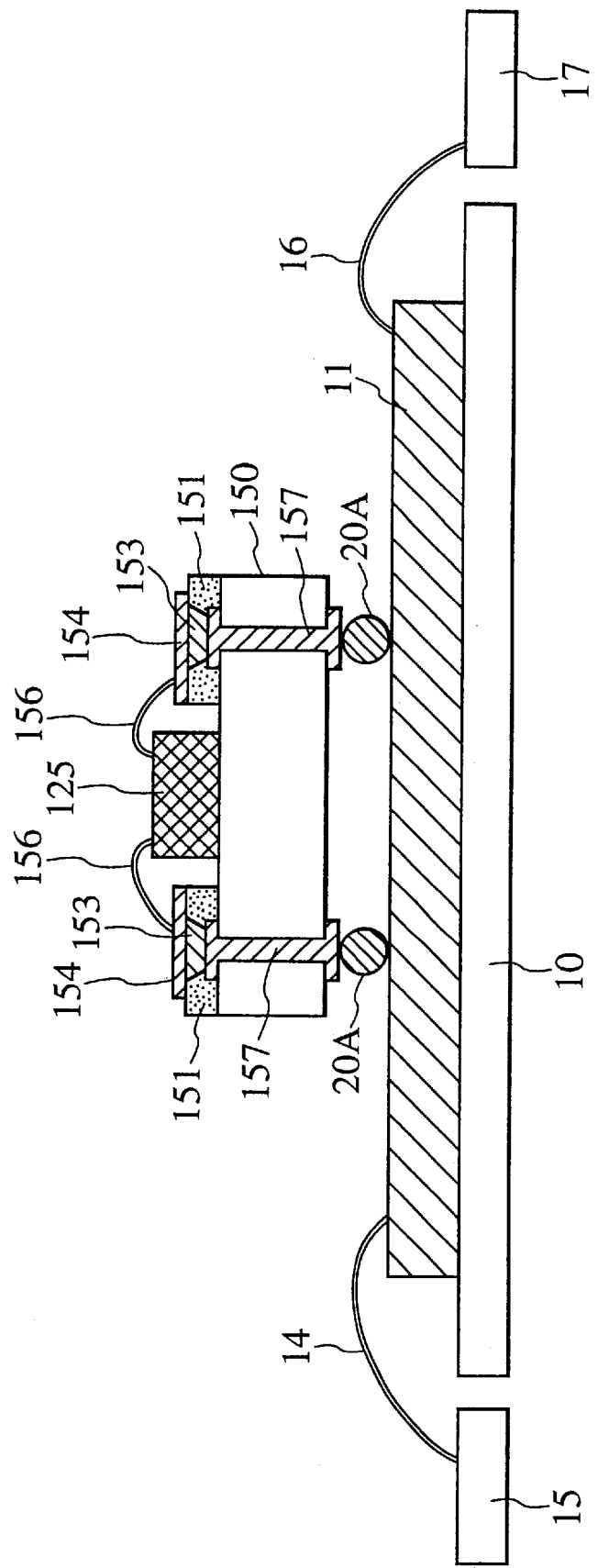
FIG. 14 is a side view of the structure of a three-dimensional MCM, other than a silicon-on-silicon type, relating to yet another embodiment of the present invention.

Furthermore, the present invention does not necessarily have to be a silicon on silicon-type MCM. As shown in FIG. 14, for instance, an external chip 125 can be mounted on a complex package, comprising ceramics 150 and resin 151, which is connected to the base chip 11 by the bumps 20A. In FIG. 14, surface metal layers 154 on the upper face of the resin 151 are electrically connected to the bumps 20A below the ceramics 150 through via hole metals 157 passing through the ceramics 150 and bumps 153 passing through the resin 151. Then, an external chip 125 is connected to the surface metal layers 154 by bonding wires 156.

Thus, the present invention of course includes various embodiments and modifications and the like which are not detailed above. Therefore, the scope of the present invention will be defined in the following claims.

What is claimed is:

1. A three-dimensional multichip module, comprising:
   (a) a base chip having:
      a first surface;
      a second surface opposed to said first surface;
      a bonding pad provided on said first surface at a peripheral region of said base chip;
      an internal circuit provided in and at proximity to a central region of said first surface; and
      a first bump pad provided at proximity to said central region except over said internal circuit;
   (b) a first bump provided on said first bump pad; and
   (c) a first external chip to be attached three-dimensionally with said base chip via said first bump so as to form a gap between said base chip and said first external chip, the first external chip having:
      a third surface;
      a fourth surface opposed to said third surface; and
      a second bump pad provided on said third surface at a corresponding position to said first bump, said second bump pad contacting said first bump.

2. The multichip module of claim 1, wherein said first bump pad is connected to an input/output buffer cell at the peripheral region of said base chip by a first wire.

3. The multichip module of claim 2, wherein at least one of an input buffer cell and an output buffer cell is provided adjacent to said bonding pad and at least one of said input buffer cell and said output buffer cell is connected to another internal circuit disposed between said bonding pad and said first bump pad by a second wire.

4. A base chip configured such that it can be combined with an external chip to form a three-dimensional multichip module, and forming a gap between the base chip and the external chip, the basechip comprising:
   a bonding pad provided at a peripheral region of said base chip;
   an internal circuit provided in and at proximity to a central region of said base chip; and
   a bump pad provided at proximity to said central region except above said internal circuit.

5. The base chip of claim 4, wherein said bump pad is connected to an input/output buffer cell at the peripheral region of said base chip by a first wire.

6. The base chip of claim 5, wherein
   at least one of an input buffer cell and an output buffer cell is provided adjacent to said bonding pad and at least one of said input buffer cell and said output buffer cell is connected to another internal circuit disposed between said bonding pad and said bump pad by a second wire.

7. The multichip module of claim 1, wherein said first surface faces said third surface, and sandwiches said gap.

8. The multichip module of claim 1, further comprising a bonding wire bonded to said bonding pad.

9. The multichip module of claim 1, further comprising a plurality of bump pads disposed on said first surface so as to form an array of bump pads with said first bump pad.

10. The base chip claim 4, further comprising a plurality of other bump pads disposed on said base chip so as to form an array of bump pads with said bump pad.

11. The multichip module of claim 3, wherein a width of said second wire is smaller than a width of said first wire.

12. The base chip of claim 6, wherein a width of said second wire is smaller than a width of said first wire.

13. The multichip module of claim 1, wherein an input/output buffer cell contacts said first bump pad.

14. The base chip of claim 6, wherein an input/output buffer cell contacts said first bump pad.

15. The multichip module of claim 13, further comprising:
   another internal circuit disposed between said bonding pad and said first bump pad; and
   a signal wire connecting said input/output buffer cell and said another internal circuit.

16. The base chip of claim 14, further comprising:
   another internal circuit disposed between said bonding pad and said bump pad; and
   a signal wire connecting said input/output buffer cell and said another internal circuit.

17. The multichip module of claim 13, further comprising:
   a second bump provided at proximity to said central region except over said internal circuit; and
   a second external chip to be attached three-dimensionally with said base chip via said second bump so as to form the gap between said base chip and said second external chip.

18. A three-dimensional multichip module, comprising:
   (a) a base chip having:
      a first surface;
      a second surface opposed to said first surface;
      a bonding pad provided on said first surface at a peripheral region of said base chip;
      an internal circuit provided in and at proximity to a central region of said first surface; and
      a first bump pad provided at proximity to said central region except over said internal circuit;
   (b) a bump provided on said first bump pad; and
   (c) a first external chip to be attached three-dimensionally with said base chip via said bump so as to form a gap between said base chip and said first external chip, said first external chip having:
      a third surface;

a fourth surface opposed to said third surface;
a via hole provided in and at a peripheral region of said first external chip so as to penetrate from said third surface to said fourth surface;
a via hole metal buried in said via hole; and
a second bump pad provided on said third surface at said via hole metal, said second bump pad contacting said bump.

19. The multichip module of claim 18, further comprising:
a third bump pad provided on said fourth surface at said via hole metal;
a second bump provided on said third bump; and
a second external chip to be attached three-dimensionally with said first external chip via said second bump so as to form a gap between said first and second external chips, the second external chip having a fifth surface and a sixth surface opposed to said fifth surface.

20. The multichip module of claim 18, wherein areas of said third and fourth surfaces are smaller than that of said first surface.

21. The multichip module of claim 19, wherein areas of said fifth and six surfaces are smaller than that of said first surface.

22. A three-dimensional multichip module, comprising:
(a) a base chip having:
a first array of bonding pads disposed on and at a first peripheral region of said base chip;
a first macrocell disposed on said base chip, being adjacent to and spatially isolated from said first array of bonding pads;
a first array of bump pads disposed on said base chip, being adjacent to and spatially isolated from said first macrocell;
a second macrocell disposed on said base chip, being adjacent to and spatially isolated from said first array of bump pads; and
a second array of bump pads disposed on said base chip, being adjacent to and spatially isolated from said second macrocell;
(b) bumps provided on said first second array of the bump pads, respectively; and
(c) an external chip to be attached three-dimensionally with said base chip via said bumps so as to form a gap between said base chip and said first external chip.

23. The multichip module of claim 22, further comprising:
a third macrocell disposed on said base chip, being adjacent to and spatially isolated from said second array of bump pads; and
a second array of bonding pads disposed on said base chip, being adjacent to and spatially isolated from said third macrocell, disposed at a second peripheral region of said base chip, said second peripheral region opposing to said first peripheral region.

24. The multichip module of claim 22, further comprising:
a random logic block disposed on said base chip, in a shape of a concave polygon having a concave portion;
wherein said second array of bonding pads is disposed in said concave portion.

25. A three-dimensional multichip module, comprising:
(a) a base chip having:
a first surface;
a second surface opposed to said first surface;
a bonding pad provided on said first surface at a peripheral region of said base chip;
an internal circuit provided in and a proximity to a central region of said first surface; and
a first bump pad provided at proximity to said central region except over said internal circuit;
(b) a bump provided on said first bump pad; and
(c) a package to be attached three-dimensionally with said base chip via said bump so as to form a gap between said base chip and said first external chip, said package having:
a insulating substrate having a third surface and a fourth surface opposing to said third surface;
a via hole penetrating said insulating substrate;
a via hole metal buried in said via hole;
a second bump pad provided on said third surface at said via hole metal, said second bump pad contacting said bump; and
an external chip disposed on said fourth surface.

* * * * *